United States Patent [19]
Lee

[11] Patent Number: 5,610,873
[45] Date of Patent: Mar. 11, 1997

[54] ADDRESS GENERATOR FOR GENERATING A PLURALITY OF ADDRESSES TO BE USED IN ZIG-ZAG SCANNING OF CONTENTS OF MEMORY ARRAY

[75] Inventor: Chen-Yi Lee, Hsinchu, Taiwan

[73] Assignee: National Science Council of R.O.C., Taipei, Taiwan

[21] Appl. No.: 619,206

[22] Filed: Mar. 21, 1996

[51] Int. Cl.⁶ ............................................. G11C 8/00
[52] U.S. Cl. .............................. 365/230.01; 365/236
[58] Field of Search .................. 365/230.01, 230.05, 365/236, 189.07, 230.06

[56] References Cited

U.S. PATENT DOCUMENTS

| | | | |
|---|---|---|---|
| 5,161,218 | 11/1992 | Catlin | 365/230.01 |
| 5,253,212 | 10/1993 | Kawaguchi | 365/230.01 |
| 5,343,439 | 8/1994 | Hoshino | 365/236 |

*Primary Examiner*—Tan T. Nguyen
*Attorney, Agent, or Firm*—Cushman Darby & Cushman, IP Group of Pillsbury Madison & Sutro, LLP

[57] ABSTRACT

An address generator includes an up/down counter driven by a clock to generate a varying output, an increment counter driven by the clock to generate an incrementing output, and a comparator comparing the varying output and the incrementing output and generating a comparing output. A first register is used for storing an initial address therein. A second register is capable of storing a plurality of step size values therein. The second register is connected electrically to the comparator to receive the comparing output and to the up/down counter to receive a least significant bit of the varying output. The second register outputs one of the step size values according to combination of the comparing output and the least significant bit of the varying output. An adder is connected electrically to the registers and generates a new address equal to a sum of the initial address and one of the step size values. The new address is to be stored in the first register so as to replace the initial address in the first register. A scan number detecting unit controls the up/down counter to generate the varying output in a first counting direction or in a second counting direction opposite to the first counting direction.

3 Claims, 5 Drawing Sheets

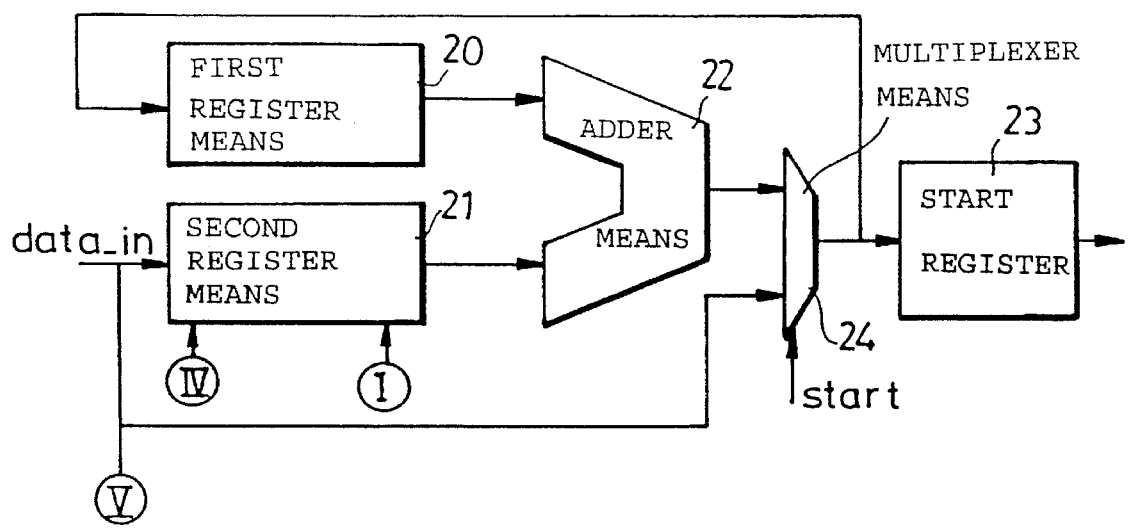
F I G. 3
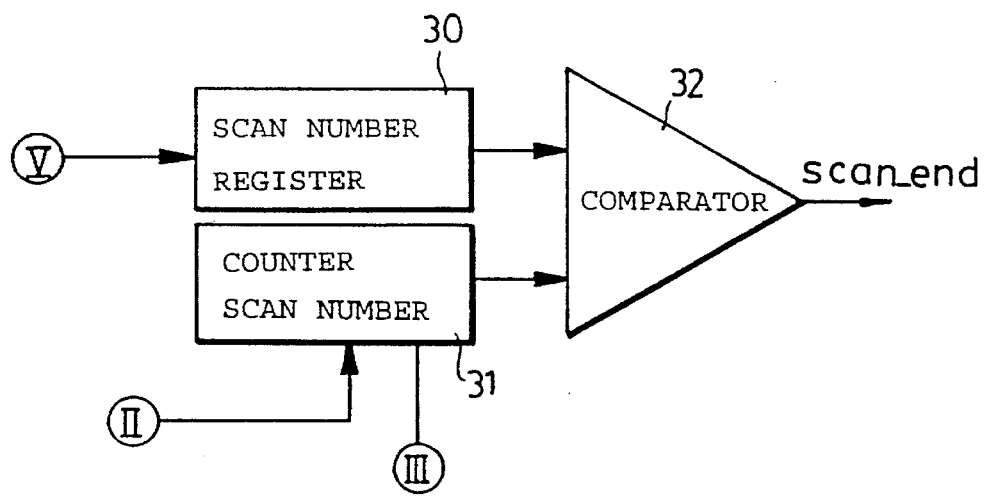
F I G. 4

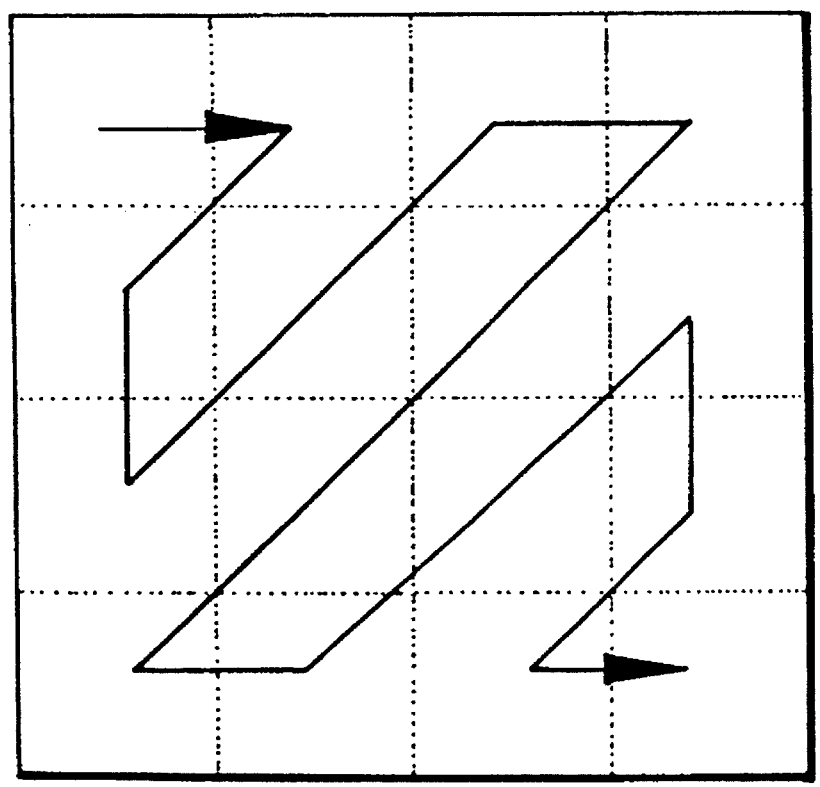
F I G. 5

| VARYING OUTPUT OF THE UP/DOWN COUNTER | INCREMENT-ING OUTPUT OF THE INCREMENT COUNTER | C1 | OUTPUT OF THE MULTIPLEXER OF THE CONTROL UNIT | LSB OF UP/DOWN COUNTER |
|---|---|---|---|---|
| 0 | 0 | 1 | 0 | 0 |
| 1 | 0 | 0 | 1 | 1 |
| 1 | 1 | 1 | 1 | 1 |
| 2 | 0 | 0 | 0 | 0 |
| 2 | 1 | 0 | 0 | 0 |
| 2 | 2 | 1 | 0 | 0 |
| 3 | 0 | 0 | 1 | 1 |
| 3 | 1 | 0 | 1 | 1 |
| 3 | 2 | 0 | 1 | 1 |
| 3 | 3 | 1 | 0 | 1 |
| 2 | 0 | 0 | 0 | 0 |
| 2 | 1 | 0 | 0 | 0 |
| 2 | 2 | 1 | 1 | 0 |
| 1 | 0 | 0 | 1 | 1 |
| 1 | 1 | 1 | 0 | 1 |

ADDRESS GENERATOR FOR GENERATING A PLURALITY OF ADDRESSES TO BE USED IN ZIG-ZAG SCANNING OF CONTENTS OF MEMORY ARRAY

BACKGROUND OF THE INVENTION

1. Field of the Invention

This invention relates to an address generator, more particularly to a low cost and highly efficient address generator for generating a plurality of addresses to be used in zig-zag scanning of the contents of a memory array.

2. Description of the Related Art

As VLSI technology advances, more and more computational power can be integrated on a single chip. Conventionally, a programmable or domain-specific processors, such as a DSP or VSP processor which is incorporated with a conventional address generator, was developed for audio or still image applications. For real-time video applications, an array of VSP processors are needed in order to meet computational requirements. To enhance computation capability, there is a need for the conventional address generator to have parallel data paths with multi-stage pipeline architecture. However, such a computational capability can only be demonstrated when data to be processed are scheduled in advance. Otherwise, idle or pipeline stall operations may be detected and hence, overall performance becomes degraded. Furthermore, the conventional address generator having parallel data paths with multi-stage pipeline architecture occupies a relatively large area of the chip so as to result in cost-inefficiency. Moreover, the conventional address generator can merely generate addresses to be used in only one of the different scanning methods, for example, zig-zag scanning, block scanning, transposed scanning, . . . , etc., available when scanning the contents of a memory array.

SUMMARY OF THE INVENTION

Therefore, the main objective of the present invention is to provide a low cost and highly efficient address generator for generating a plurality of addresses to be used in zig-zag scanning of the contents of a memory array.

Another objective of the present invention is to provide an address generator which can further generate a plurality of addresses to be used in block scanning of the contents of a memory array.

According to the present invention, an address generator for generating a plurality of addresses to be used in zig-zag scanning of the contents of a memory array includes a control unit, an address generating unit and a scan number detecting unit. The control unit includes a clock, an Up/down counter driven by the clock to generate a varying output, an increment counter driven by the clock to generate an incrementing output, and a comparator having a first input terminal connected electrically to the up/down counter to receive the varying output and a second input terminal connected electrically to the increment counter to receive the incrementing output. The comparator compares the varying output and the incrementing output and generates a comparing output which enables the up/down counter and which resets the increment counter when the varying output is equal to the incrementing output, and which disables the up/down counter when the varying output is not equal to the incrementing output. The address generating unit includes a first register means for storing an initial address therein and a second register means capable of storing a plurality of step size values therein. The second register means has a first input connected electrically to the comparator for receiving the comparing output from the comparator, and a second input connected electrically to the up/down counter for receiving a least significant bit of the varying output. The second register means outputs one of the step size values according to the combination of the comparing output and the least significant bit of the varying output. The address generating unit further includes an adder means, connected electrically to the first and second register means, for generating a new address equal to a sum of the initial address from the first register means and the step size value outputted from the second register means. The new address is to be stored in the first register means so as to replace the initial address in the first register means. The scan number detecting unit detects whether the number of addresses generated so far is equal to the size of the memory array. The detecting unit is connected electrically to the up/down counter so as to enable the up/down counter to generate the varying output in a first counting direction when the number of addresses generated so far is less than one half of the size of the memory array and so as to enable the up/down counter to generate the varying output in a second counting direction when the number of addresses generated so far is more than one half of the size of the memory array.

The control unit further comprises a boundary register means for storing a column boundary parameter therein, and a multiplexer means having a first input terminal connected electrically to the up/down counter to receive the varying output, a second input terminal connected electrically to the boundary register means to receive the column boundary parameter, and an output terminal connected electrically to the first input terminal of the comparator. The multiplexer means is operable to present selectively the varying output at the output terminal thereof when the address generator generates addresses to be used in zig-zag scanning of the contents of the memory array. The initial address includes an initial row address and an initial column address. The multiplexer means is further operable to present selectively the column boundary parameter at the output thereof to enable the comparator to compare the column boundary parameter and the incrementing output from the increment counter. The comparator generates the comparing output which resets the increment counter when the column boundary parameter is equal to the incrementing output from the increment counter. The second register means is further capable of storing a column increment value and a row increment value therein and outputs one of the column and row increment values according to the comparing output. The adder means generates a new column address equal to a sum of the initial address from the first register means and the column increment value from the second register means when the column boundary parameter is not equal to the incrementing output. The new column address is to be stored in the first register means so as to replace the initial column address in the first register means. The adder means further generates a new row address equal to a sum of the initial address and the row increment value when the column boundary parameter is equal to the incrementing output. The new row address is to be stored in the first register means so as to replace the initial row address in the first register means.

BRIEF DESCRIPTION OF THE DRAWINGS

Other features and advantages of the present invention will become apparent in the following detailed description of the preferred embodiments, with reference to the accompanying drawings, of which:

FIG. 3 is a schematic block diagram of an address generating unit of the first preferred embodiment;

FIG. 4 is a schematic block diagram of a scan number detecting unit of the first preferred embodiment;

FIG. 5 is a schematic view showing a memory array, the contents of which are to be scanned with the use of a plurality of addresses generated by the first preferred embodiment;

FIG. 6 is a table illustrating the relationship among a varying output of an up/down counter, an incrementing output of an increment counter, a comparing output of a comparator, and a least significant bit of the varying output;

DETAILED DESCRIPTION OF THE PREFERRED EMBODIMENTS

Figure 1:
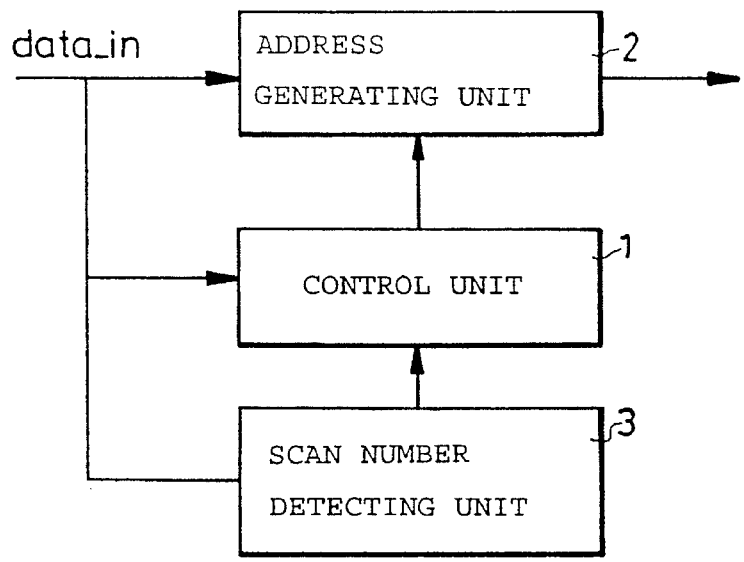
FIG. 1 is a schematic block diagram of a first preferred embodiment of an address generator according to the present invention.

Before the present invention is described in greater detail, it should be noted that like elements are indicated by the same reference numerals throughout the disclosure.

Referring to FIG. 1, the first preferred embodiment of an address generator according to the present invention includes a control unit 1, an address generating unit 2 and a scan number detecting unit 3.

Figure 2:
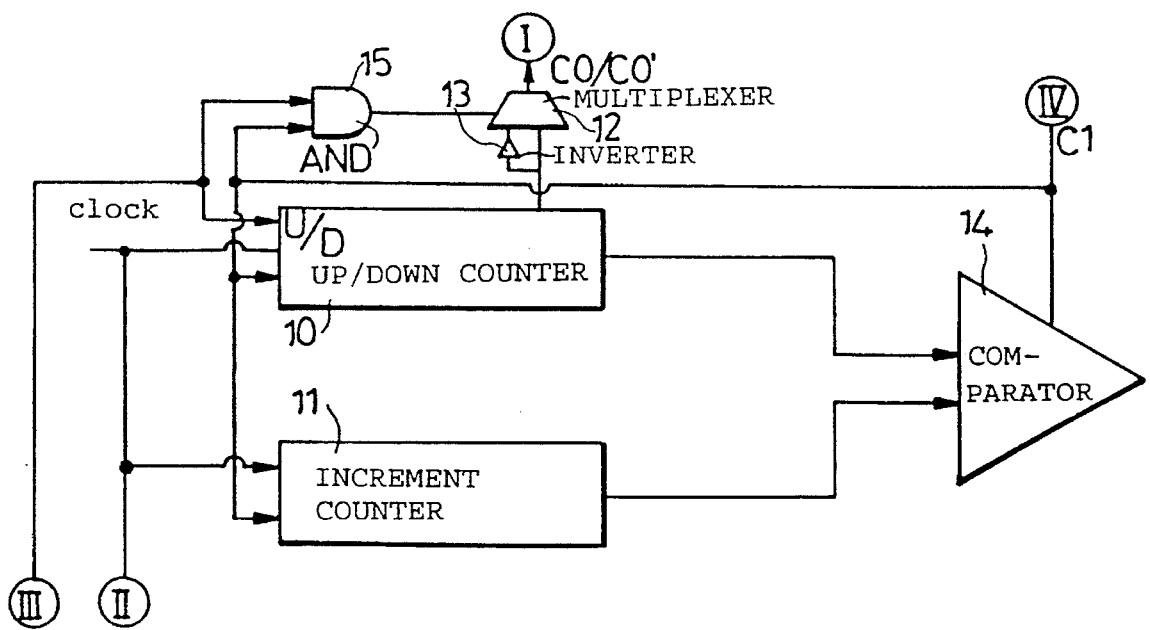
FIG. 2 is a schematic block diagram of a control unit of the first preferred embodiment.

Referring now to FIGS. 1 and 2, the control unit 1 includes an up/down counter 10 which is connected electrically to and driven by a clock to generate a varying output. An increment counter 11 is also connected electrically to and driven by the clock to generate an incrementing output. A multiplexer 12 has a first input terminal connected electrically to the up/down counter 10 to receive the least significant bit (CO) of the varying output and a second input terminal connected electrically to the up/down counter 10 via an inverter 13 to receive an inversion (CO') of the least significant bit (CO) of the varying output. A comparator 14 has a first input terminal connected electrically to the up/down counter 10 to receive the varying output and a second input terminal connected electrically to the increment counter 11 to receive the incrementing output. The comparator 14 compares the varying output and the incrementing output and generates a comparing output (C1) which is fed back to the up/down counter 10 and the increment counter 11. The comparing output (C1) enables the up/down counter 10 and resets the increment counter 11 when the varying output is equal to the incrementing output, and disables the up/down counter 10 when the varying output is not equal to the incrementing output. An AND gate 15 has a first input terminal, a second input terminal connected electrically to the comparator 14 to receive the comparing output (C1), and an output terminal connected electrically to a select line of the multiplexer 12.

Referring now to FIGS. 1, 2 and 3, the address generating unit 2 includes a first register means 20 for storing an initial address therein, a second register means 21 capable of storing a plurality of step size values therein, an adder means 22, a multiplexer means 24 and a start register 23.

The second register means 21 has a first input connected electrically to the comparator 14 for receiving the comparing output (C1) from the comparator 14, a second input connected electrically to an output terminal of the multiplexer 12 to receive one of the least significant bit (CO) of the varying output and the inversion (CO') of the least significant bit (CO) of the varying output, and a third input connected electrically to a data line (data_in) through which data, such as step size values, initial address and total number of scanning operations to be performed, is transmitted. The second register means 21 outputs one of the step size values according to the combination of the comparing output (C1) and one of the least significant bit (CO) of the varying output and the inversion (CO') of the least significant bit (CO) of the varying output.

The adder means 22 is connected electrically to the first and second register means, 20 and 21, and generates a new address equal to a sum of the initial address from the first register means 20 and an appropriate one of the step size values from the second register means 21.

The multiplexer means 24 has a first input terminal connected electrically to the adder means 22 to receive the new address, a second input terminal connected electrically to the data line (data_in), and an output terminal connected electrically to an input terminal of the first register means 20.

The start register 23 has an input terminal connected electrically to the output terminal of the multiplexer means 24 and an output terminal for outputting the new address.

Referring now to FIGS. 1, 2 and 4, the scan number detecting unit 3 includes a scan number register 30, connected electrically to the data line (data_in), for storing total number of scanning operations to be performed. A scan number counter 31 is connected electrically to and is driven by the clock to count the number of scanning operations performed so far. A comparator 32 compares the total number of scanning operations to be performed and the number of scanning operations performed so far. The comparator 32 generates a flag signal (scan_end) when the total number of scanning operations to be performed is equal to the number of scanning performed so far. It should be noted that, the total number of scanning operations to be performed is equal to the size of the memory array (not shown), and that the number of scanning operations performed so far is equal to the number of addresses generated so far. The scan number counter 31 is connected electrically to the up/down counter 10 and the AND gate 15 of the control unit 1 so as to transmit the most significant bit of the output of the scan number counter 31 to the up/down counter 10 for the control of the counting direction of the up/down counter 10, and to the AND gate 15.

Referring now to FIGS. 2 to 6, a memory array having a block size of 4×4 is selected for describing the operation of the first preferred embodiment by way of illustration. Initially, the initial address transmitted on the data line (data in) is stored in the first register means 20 and the start register 23 via the multiplexer means 24. The step size values transmitted through the data line (data_in) are stored in the first register means 20 via the third input of the latter. The total number of scanning to be performed is transmitted through the data line (data_in) and is stored in the scan number register 30. In the present embodiment, the step size values stored are the values of 1, 4, −3 and 3. The second register means 21 outputs the value of 1 when the output of the multiplexer 12 is 0 and the comparing output (C1) is 1. The second register means 21 outputs the value of 4 when the output of the multiplexer 12 is 1 and the comparing output (C1) is 1. The second register means 21 outputs the value of 3 when the output of the multiplexer 12 is 1 and the comparing output (C1) is 0. The second register means 21 outputs the value of −3 when the output of the multiplexer 12 is 0 and the comparing output (C1) is 0. When a start signal (start) is transmitted to the multiplexer means 24, a new address is generated and output by the start register 23, while the multiplexer means 24 selectively presents the output of the adder means 22 at the output terminal thereof. The new address is stored in the first register means 20 so as to replace the initial address. It should be noted that the new address that is output immediately after the start signal is transmitted becomes the new initial address.

Then, the comparator 14 compares the varying output of the up/down counter 10 and the incrementing output of the increment counter 11. Since the up/down counter 10 and the increment counter 11 are initially reset, both the varying output of the up/down counter 10 and the increment output of the increment counter 11 are equal to 0. Thus, the comparator 14 generates a comparing output equal to 1 which enables the up/down counter 10 and resets the increment counter 11. Since the number of addresses generated so far is less than one half of the size of the memory array, the most significant bit of the output of the scan number counter 31 is equal to 0, thereby enabling the up/down counter 10 to generate the varying output in a first counting direction, that is, in an up counting direction. Furthermore, since the most significant bit of the output of the scan number counter 31 is equal to 0, the multiplexer 12 selectively presents the least significant bit of the varying output at the output terminal thereof no matter what the value of the comparing output (C1) is. At this time, since the least significant bit (CO) of the varying output is equal to 0, the second register means 21 thus outputs the value of 1. The adder means 22 generates a new address equal to a sum of the initial address from the first register means 20 and the value of 1 from the second register means 21. The new address is stored in the first register means 20 so as to replace the initial address in the first register means 20.

Thereafter, the comparator 14 compares the varying output of the up/down counter 10 and the incrementing output of the increment counter 11. At this time, since the varying output of the up/down counter 10 is equal to 1, while the incrementing output of the increment counter 11 is equal to 0, the comparator 14 generates a comparing output equal to 0 which disables the up/down counter 10. Since the least significant bit (CO) of the varying output is equal to 1, the second register means 21 thus outputs the value of 3. The adder means 22 generates a new address equal to a sum of the initial address from the first register means 20 and the value of 3 from the second register means 21. The new address is stored in the first register means 20 so as to replace the initial address in the first register means 20.

Thereafter, the comparator 14 compares the varying output of the up/down counter 10 and the incrementing output of the increment counter 11. At this time, since the varying output of the up/down counter 10 and the incrementing output of the increment counter 11 are both equal to 1, the comparator 14 generates a comparing output equal to 1 which enables the up/down counter 10 and which resets the increment counter 11. Since the least significant bit (CO) of the varying output is equal to 1, the second register means 21 thus outputs the value of 4. The adder means 22 generates a new address equal to a sum of the initial address from the first register means 20 and the value of 4 from the second register means 21. The new address is stored in the first register means 20 so as to replace the initial address in the first register means 20.

Since the operation of the first preferred embodiment before the number of addresses generated is more than one half of the size of the memory array is similar to that described above, a detailed description thereof is thus omitted herein.

After the number of addresses generated so far is more than one half of the size of the memory array, the most significant bit of the scan number counter 31 is equal to 1. Thus, the up/down counter 10 is enabled to generate the varying output in a second counting direction, that is, in a down counting direction. Furthermore, since the most significant bit of the scan number counter 31 is equal to 1, the multiplexer 12 selectively presents the inversion (CO') of the least significant bit (CO) of the varying output at the output terminal thereof when the comparing output (C1) is equal to 1, and selectively presents the least significant bit (CO) of the varying output at the output terminal thereof when the comparing output (C1) is equal to 0. Therefore, as shown in FIG. 6, when the varying output of the up/down counter 10 and the incrementing output of the increment counter 11 are both equal to 3, the comparator 14 generates the varying output equal to 1. The multiplexer 12 thus selectively presents the inversion (CO') of the least significant bit (CO) of the varying output at the output thereof so that the second register means 21 outputs the value of 1. The adder means 22 generates a new address equal to a sum of the initial address from the first register means 20 and the value of 1 from the second register means 21. The new address is stored in the first register means 20 so as to replace the initial address.

Thereafter, the comparator 14 compares the varying output of the up/down counter 10 and the incrementing output of the increment counter 11. At this time, since the varying output of the up/down counter 10 is equal to 2, while the incrementing output of the increment counter 11 is equal to 0, the comparator 14 generates a comparing output (Cl) equal to 0, thereby disabling the up/down counter 10. Since the comparing output (Cl) is equal to 0, the multiplexer 12 selectively presents the least significant bit (CO) of the varying output at the output terminal thereof. The second register means 21 thus outputs the value of −3. The adder means 22 generates a new address equal to a sum of the initial address from the first register means 20 and the value of −3 from the second register means 21. The new address is stored in the first register means 20 so as to replace the initial address in the first register means 20. Since the operation of the first preferred embodiment thereafter is similar to that described above, a detailed description thereof is thus omitted herein.

When the number of addresses generated is equal to the size of the memory array, that is, the total number of scanning operations performed is equal to the number of scanning operations to be performed, the comparator 32 generates the flag signal (scan end).

From the foregoing, it should be appreciated that the structure of the first preferred embodiment is relatively simple and can prevent the occurrence of idle or pipeline stall operations that are associated with the prior art, thereby resulting in cost reduction and increased efficiency.

Figure 7:
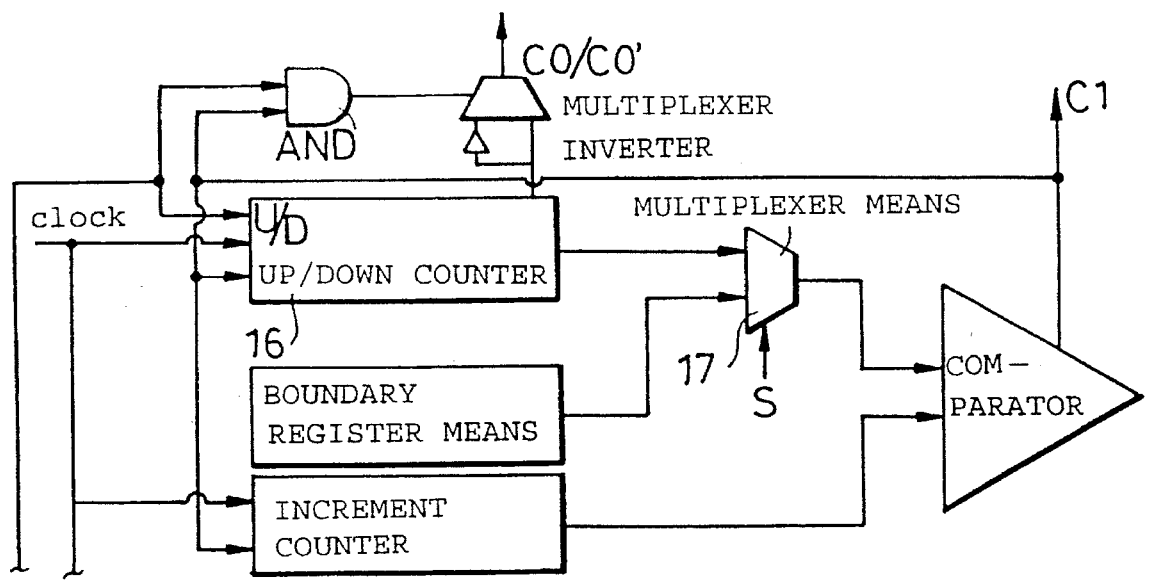
FIG. 7 is a schematic block diagram of an address generating unit of a second preferred embodiment of an address generator according to the present invention.

Referring now to FIG. 7, a second preferred embodiment is shown. The second preferred embodiment can also generate a plurality of addresses to be used in block scanning of the contents of a memory array, in addition to the generation of a plurality of addresses to be used in zig-zag scanning of the contents of the memory array.

Unlike the first preferred embodiment, the control unit 1 of the second preferred embodiment further includes a boundary register means 16 for storing a column boundary parameter therein. It should be noted that the column boundary parameter is stored in the boundary register means 16 through the data line (data_in) shown in FIG. 1. A multiplexer means 17 has a first input terminal connected electrically to the up/down counter 10 to receive the varying output, a second input terminal connected electrically to the boundary register means 16 to receive the column boundary parameter, and an output terminal connected electrically to the first input terminal of the comparator 14. The multiplexer means 17 is operable to present selectively the varying output at the output terminal thereof when the address generator generates addresses to be used in zig-zag scanning of the contents of the memory array.

Figure 8:
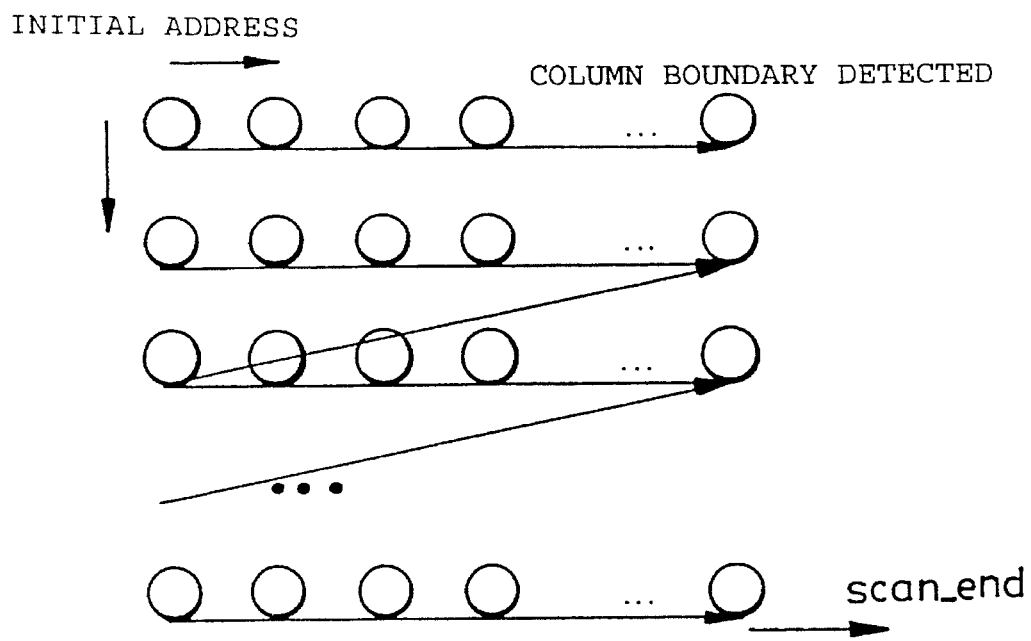
FIG. 8 is a schematic view showing a memory array, the contents of which are to be scanned with the use of a plurality of addresses generated by the second preferred embodiment.

Referring now to FIGS. 7 and 8, operation of the second preferred embodiment is now described. In the present embodiment, the initial address includes an initial row address and an initial column address. To achieve the block scan operation shown in FIG. 8, the multiplexer means 17 is operable by a select signal (S) to present selectively the column boundary parameter at the output thereof to enable the comparator 14 to compare the column boundary parameter and the incrementing output from the increment counter 11. The comparator 14 generates the comparing output (C1) which resets the increment counter 11 when the column boundary parameter is equal to the incrementing output from the increment counter 11. The second register means is further capable of storing a column increment value and a row increment value therein via the third input thereof through the data line (data_in), and outputs one of the column and row increment values according to the comparing output (C1). In the present embodiment, the least significant bit (CO) of the varying output of the up/down counter 10 is always zero and is thus a don't care bit. The column increment value is output from the second register means when the column boundary parameter is not equal to the incrementing output of the increment counter 11, that is, when the comparing output (C1) is equal to 0. The row increment value is output from the second register means when the column boundary parameter is equal to the incrementing output of the increment counter 11, that is, when the comparing output (Cl) is equal to 1. The increment counter 11 is reset when the comparing output (C1) is equal to 1. Similar to the first preferred embodiment, the adder means generates a new column address equal to a sum of the initial address from the first register means and the column increment value from the second register means when the column boundary parameter is not equal to the incrementing output. The new column address is stored in the first register means so as to replace the initial column address in the first register means. Similarly, the adder means generates a new row address equal to a sum of the initial address and the row increment value when the column boundary parameter is equal to the incrementing output. The new row address is stored in the first register means so as to replace the initial row address in the first register means. When the number of addresses generated is equal to the size of the memory array, the scan number detecting unit of the second preferred embodiment also generates a flag signal (scan_end).

It should be noted that, since the structures of the address generating unit and the scan number detecting unit of the second preferred embodiment are similar to those of the first preferred embodiment, detailed descriptions thereof are thus omitted herein.

Accordingly, the address generator of the present invention has the following advantages:

1. The structure of the present invention is relative simple, thereby resulting in cost reduction.

2. The structure of the present invention can prevent the occurrence of idle and pipeline stall operations, thereby resulting in increased efficiency.

3. The structure of the present invention can also generate a plurality of addresses to be used in block scanning of the contents of a memory array, in addition to the generation of a plurality of addresses to be used in zig-zag scanning of the contents of the memory array, by introducing simple modifications.

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. An address generator for generating a plurality of addresses to be used in zig-zag scanning of contents of a memory array, said address generator comprising:

a control unit including
   a clock,
   an up/down counter driven by said clock to generate a varying output,
   an increment counter driven by said clock to generate an incrementing output, and
   a comparator having a first input terminal connected electrically to said up/down counter to receive said varying output and a second input terminal connected electrically to said increment counter to receive said incrementing output, said comparator comparing said varying output and said incrementing output and generating a comparing output which enables said up/down counter and which resets said increment counter when said varying output is equal to said incrementing output, and which disables said up/down counter when said varying output is not equal to said incrementing output;

an address generating unit including
   a first register means for storing an initial address therein,
   a second register means capable of storing a plurality of step size values therein, said second register means having a first input connected electrically to said comparator for receiving said comparing output from said comparator, and a second input connected electrically to said up/down counter for receiving a least significant bit of said varying output, said second register means outputting one of said step size values according to combination of said comparing output and said least significant bit of said varying output, and
   an adder means, connected electrically to said first and second register means, for generating a new address equal to a sum of said initial address from said first register means and said one of said step size values from said second register means, said new address to be stored in said first register means so as to replace said initial address in said first register means; and a scan number detecting unit for detecting whether number of addresses generated so far is equal to size of the memory array, said detecting unit being connected electrically to said up/down counter so as to enable said up/down counter to generate said varying output in a first counting direction when the number of addresses generated so far is less than one half of the size of the memory array and so as to enable said up/down counter to generate said varying output in a second counting direction when the number of addresses generated so far is more than one half of the size of the memory array.

2. An address generator as claimed in claim 1, wherein said control unit further comprises a boundary register means for storing a column boundary parameter therein, and a multiplexer means having a first input terminal connected electrically to said up/down counter to receive said varying output, a second input terminal connected electrically to said boundary register means to receive said column boundary parameter, and an output terminal connected electrically to said first input terminal of said comparator, said multiplexer means being operable to present selectively said varying output at said output terminal thereof when said address generator generates addresses to be used in zig-zag scanning of the contents of the memory array.

3. An address generator as claimed in claim 2, wherein said initial address includes an initial row address and an initial column address, said multiplexer means being further operable to present selectively said column boundary parameter at said output thereof to enable said comparator to compare said column boundary parameter and said incrementing output from said increment counter, said comparator generating said comparing output which resets said increment counter when said column boundary parameter is equal to said incrementing output from said increment counter, said second register means being further capable of storing a column increment value and a row increment value therein and outputting one of said column and row increment values according to said comparing output, said adder means generating a new column address equal to a sum of said initial address from said first register means and said column increment value from said second register means when said column boundary parameter is not equal to said incrementing output, said new column address to be stored in said first register means so as to replace said initial column address in said first register means, said adder means further generating a new row address equal to a sum of said initial address and said row increment value when said column boundary parameter is equal to said incrementing output, said new row address to be stored in said first register means so as to replace said initial row address in said first register means.

* * * * *